(12) United States Patent
Ararao et al.

(10) Patent No.: US 12,703,625 B2
(45) Date of Patent: Aug. 11, 2026

(54) THROUGH-SUBSTRATE CONDUCTOR SUPPORT

(71) Applicant: Texas Instruments Incorporated, Dallas, TX (US)

(72) Inventors: Virgil Cotoco Ararao, McKinney, TX (US); John Charles Emhke, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 116 days.

(21) Appl. No.: 17/365,067

(22) Filed: Jul. 1, 2021

(65) Prior Publication Data

US 2021/0323816 A1 Oct. 21, 2021

Related U.S. Application Data

(62) Division of application No. 16/551,108, filed on Aug. 26, 2019, now Pat. No. 11,084,717, which is a (Continued)

(51) Int. Cl.

| | |
|---|---|
| ***H10W 74/10*** | (2026.01) |
| ***B81B 7/00*** | (2006.01) |
| ***B81C 1/00*** | (2006.01) |
| ***H10W 70/60*** | (2026.01) |
| ***H10W 70/65*** | (2026.01) |

(Continued)

(52) U.S. Cl.

CPC .......... *B81C 1/00873* (2013.01); *B81B 7/007* (2013.01); *H10W 74/121* (2026.01); *H10W 74/124* (2026.01); *B81B 2203/0315* (2013.01); *B81B 2207/098* (2013.01); *B81C 2203/0118* (2013.01); *B81C 2203/0136* (2013.01); *B81C 2203/0172* (2013.01); *H10W 70/60* (2026.01); *H10W 70/65* (2026.01); *H10W 72/01515* (2026.01); *H10W 72/01925* (2026.01); *H10W 72/0198* (2026.01); *H10W 72/075* (2026.01); *H10W 72/242* (2026.01); *H10W 72/244* (2026.01); *H10W 72/29* (2026.01); *H10W 72/877* (2026.01); *H10W 72/922* (2026.01); *H10W 72/923* (2026.01); *H10W 72/934* (2026.01); *H10W 72/944* (2026.01);

(Continued)

(58) Field of Classification Search

None

See application file for complete search history.

(56) References Cited

U.S. PATENT DOCUMENTS

| | | | | |
|---|---|---|---|---|
| 2013/0082383 A1* | 4/2013 | Aoya | .................. | H01L 25/0657 438/118 |
| 2013/0093104 A1 | 4/2013 | Wu et al. | | |
| 2019/0382262 A1 | 12/2019 | Ararao et al. | | |

* cited by examiner

*Primary Examiner* — Jack S Chen

(74) *Attorney, Agent, or Firm* — Michael T. Gabrik; Frank D. Cimino

(57) ABSTRACT

In described examples, a first device on a first surface of a substrate is coupled to a structure arranged on a second surface of the substrate. In at least one example, a first conductor arranged on the first surface is coupled to circuitry of the first device. An elevated portion of the first conductor is supported by disposing an encapsulate and curing the encapsulate. The first conductor is severed by cutting the encapsulate and the first conductor. A second conductor is coupled to the first conductor. The second conductor is coupled to the structure arranged on the second surface of the substrate.

20 Claims, 9 Drawing Sheets

Related U.S. Application Data division of application No. 15/433,704, filed on Feb. 15, 2017, now Pat. No. 10,392,246.

(60) Provisional application No. 62/441,034, filed on Dec. 30, 2016.

(51) Int. Cl.

| | |
|---|---|
| ***H10W 72/00*** | (2026.01) |
| ***H10W 72/20*** | (2026.01) |
| ***H10W 72/90*** | (2026.01) |
| *H10W 72/29* | (2026.01) |
| *H10W 80/00* | (2026.01) |
| *H10W 90/00* | (2026.01) |

(52) U.S. Cl.

CPC ........ *H10W 72/952* (2026.01); *H10W 80/743* (2026.01); *H10W 90/753* (2026.01)

300
132
130b
126b
104b
120
124
122
112
114
116
102
118
208
110
108
308
130a
126a
104a 400
132
130b
126b
104b
120
124
122
112
114
116
118
208
408
408a
110
108
308
130a
126a
104a 500
132
130b
126b
104b
110
120
124
122
112
114
116
118
208
408
408a
508
108
308
130a
126a
104a 600
608

700
132
130b
126b
104b
110
120
124
122
112
114
116
118
208
408
408a
508
108
308
130a
126a
104a
708

800
208b
208a
808

1132
126a
104a
1130
120
122
124
116
114
112
1102
208
108
118
110
126b
104b
1100

1132
126a
104a
1130
120
122
124
116
114
112
1102
1208
208
108
118
110
126b
104b
1200

1300
126b
104b
110
120
124
122
112
114
116
1102
1208
118
1130
208
1308
108
308
126a
104a
1132

1400
1408

1100
126b
104b
110
120
124
122
112
114
116
1508
118
1130
208
1308
108
308
126a
104a
1132

1200
1608

THROUGH-SUBSTRATE CONDUCTOR SUPPORT

CROSS-REFERENCE TO RELATED APPLICATIONS

This application is a divisional of U.S. patent application Ser. No. 16/551,108 filed Aug. 26, 2019, which is a divisional of U.S. patent application Ser. No. 15/433,704 filed Feb. 15, 2017, which claims priority to U.S. Provisional Patent Application Ser. No. 62/441,034 filed Dec. 30, 2016, which Applications are hereby incorporated herein by reference in their entireties.

BACKGROUND

Electronic circuits are often manufactured as integrated circuits formed by processing silicon wafers. Many such wafers contain individual circuit designs where the individual circuits are replicated in manufacturing processes on a single wafer. The replicated circuits are separated as dies ("chips") by cutting the wafer in a saw-lane space provided between adjacent replicated circuits. Increasing complexities and applications for circuit designs have led to a relatively broad and varied selection of packages for securing, protecting and coupling individual die. For example, chip-scale technology packaging includes direct surface-mount packages occupying a surface area (e.g., footprint) marginally larger (e.g., 1.2 times larger) than the area of the die. Such constraints have led to increased costs for packages with relatively large numbers of contacts (e.g., pins) and occupying relatively small footprints.

SUMMARY

In described examples, a first device on a first surface of a substrate is coupled to a structure arranged on a second surface of the substrate. In at least one example, a first conductor arranged on the first surface is coupled to circuitry of the first device. An elevated portion of the first conductor is supported by disposing an encapsulate and curing the encapsulate. The first conductor is severed by cutting the encapsulate and the first conductor. A second conductor is coupled to the first conductor. The second conductor is coupled to the structure arranged on the second surface of the substrate.

DETAILED DESCRIPTION OF EXAMPLE EMBODIMENTS

Figure 1:
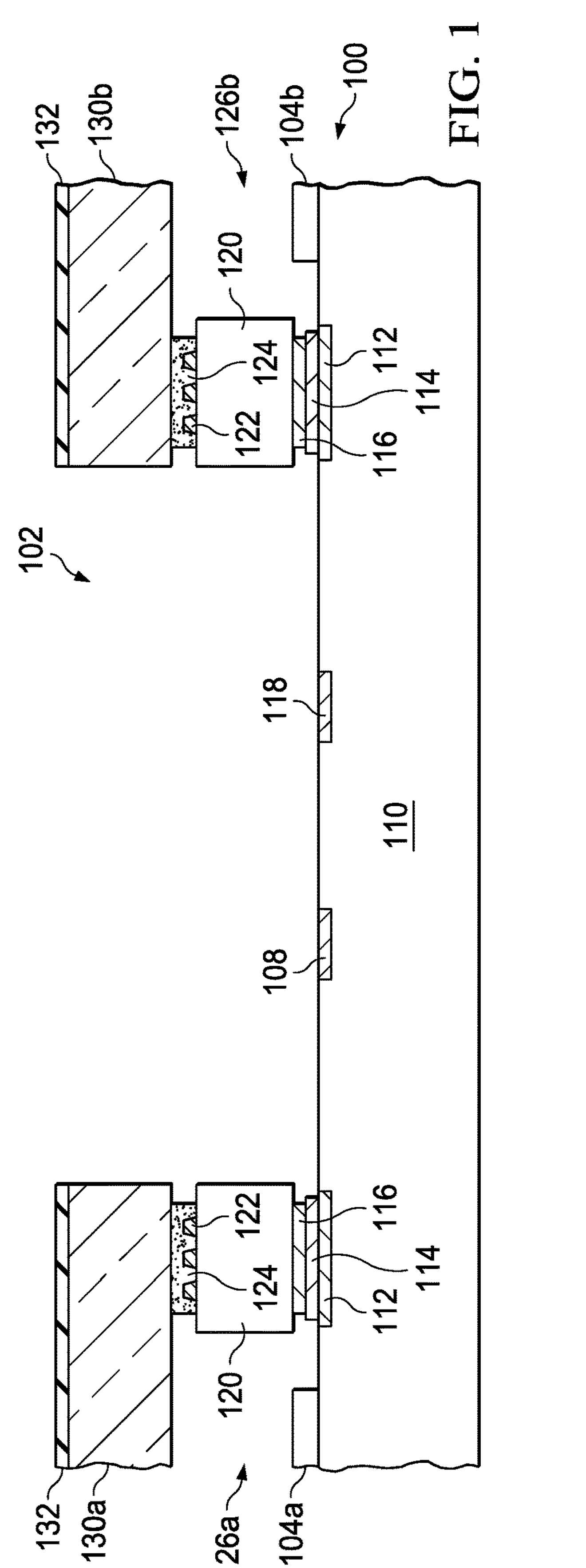
FIG. 1 is a section view of a bonded wafer assembly including exposed bonding wire(s) in accordance with example embodiments.

In this description, if a first device couples to a second device, that connection can be made through a direct electrical connection, or through an indirect electrical connection via other devices and connections. The term "portion" can mean an entire portion or a portion that is less than the entire portion. The term "package" can mean a sealed container, which can include die, or wafers or even larger equipment including devices and circuitry in a local environment that is sealed from an outside environment. The term "encapsulant" can mean a substance that encapsulates and, when cured, supports a portion of a conductor (such as a wire bond or circuit trace affixed to a substrate, which, in turn, supports the encapsulate).

Also, in this description, the term "formed in a substrate" can mean being formed such that the formed structure is supported by the substrate, and a portion of the formed structure is formed at a height level with at least one exposed (e.g., previously exposed) surface of the substrate. The term "formed on a substrate" can mean being formed such that the formed structure is supported by the substrate. The term "run" can mean the path along which a conductor (e.g., net, trace, plane, conductive layer, segment, stub, wire, or line) is formed.

Chip-scale technology packaging includes direct surface-mount packages where the footprint of such packages is marginally larger than the area of the die (e.g., to be mounted in a suitable package). Direct surface-mount packages include a number of IO (input/output) contacts (e.g., solder balls) arranged in an (e.g., rectangular) array on a lower surface of a die. Costs are increased because of process steps used to couple upper-surface contacts with the IO contacts on the lower surface of the die. (The IO contacts can include solder balls for bonding to package contacts, which are, in turn, coupled to package pins.) Because the IO contacts are arranged as an array, the number of contacts (e.g., assuming constant sizing) possible grows quadratically with respect to the length of two (e.g., orthogonal) sides of the die.

In contrast, wire-bonded chips include a relatively limited number of IO contacts arranged around the periphery of a die, in which a wirebond couples an upper-surface contact to an associated package contact (e.g., for coupling to a package pin). Because the IO contacts are arranged in an upper surface of and around the perimeter of the die, the number of possible contacts of wirebonded chips grows linearly in proportion to the perimeter of a die.) Various wirebonding techniques are cited in U.S. Pat. Nos. 8,878,353 and 9,095,074, which are hereby fully incorporated by reference herein.

Although the direct surface mount packages can provide relatively higher numbers of IO signal (e.g., including power) contacts, the cost of producing die suited for direct surface mounting is substantially increased. Such costs are increased because of additional processing steps used for routing signals routed across a first (e.g., upper) surface of a die to contacts on a second (e.g., lower) surface of the die that is below the first surface. Signals are routed from the first surface to the second surface of the die using TSVs (through-silicon vias), which entails substantial costs and also increases the layout footprint of a circuit formed on a die.

In the production of semiconductors, and particularly in the production of microelectromechanical system (MEMS) devices, each MEMS device (e.g., which include and are included in integrated circuits) is produced as one instance of many devices arranged in rows and columns (e.g., in an array) on a single wafer. Such arrangements decrease costs because many devices can be formed by simultaneously applying process steps. MEMS devices can be formed on a first wafer (such as a silicon wafer), over which a second wafer (such as a glass wafer) is bonded to form a bonded wafer assembly.

Cavities (e.g., open spaces) can be formed in a bonded wafer assembly by forming cavity sidewalls on the first wafer, which creates vacant spaces that can be sealed by bonding the second wafer to the top edges of the sidewalls of the first wafer. In described embodiments, a MEMS device is disposed in a cavity such that the MEMS device is protected from an outside environment (however, electrical signals are coupled to and from the MEMS device via routed conductors for traversing an associated sidewall).

Cavities can also be formed in a bonded wafer assembly by selectively removing sections of material from various areas of the second wafer (e.g., top wafer) of the bonded wafer assembly. Selected portions of material of the second wafer can be selectively removed (e.g., cut and/or etched) to provide access for subsequent processing of the bond pads and other structures covered by the second wafer. For example, access to the bond pads in a bonded wafer assembly is attained by removing selected portions of the second wafer (whereas the first wafer is not cut—or not cut through—such that the bonded wafer assembly is not singulated when the bond pads are exposed by cutting through the second wafer).

A process for manufacturing supported die-edge conductors is now generally described. A first conductor is arranged to traverse a portion of a cavity formed by selectively removing a portion of the second wafer. For example, the first conductor is a bonding wire (e.g., of a wirebond), where the boding wire includes an original first end affixed to a first bonding pad of the first wafer and including an original second end affixed to a second bonding pad of the first wafer. (The second bonding pad can be coupled to an equivalent circuit of another instance of a replicated circuit when the replicated circuit is a mirror-image of the circuit of the first bonding pad.) The first conductor is arranged to traverse (e.g., run through or cross over) a "saw-lane," which is an area reserved (e.g., for a saw cut to be made) for singulating (e.g., separating) die from the bonded wafer assembly. The saw-lane extends (at least) through the first wafer, is subjacent to an elevated portion of the first conductor and traverses a space between the first and second bonding pads.

The first conductor is encapsulated (e.g., and supported by) by surrounding the first conductor with a supporting material (e.g., a curable encapsulant and/or an epoxy mold compound) after the first conductor is affixed to (e.g., soldered to) bond pads of the first (e.g., upper) surface of the bonded wafer. The supporting material is cured (e.g., hardened) such that the first conductor is material mechanically supported (e.g., immobilized relative to the bonded wafer assembly) in preparation for being severed.

The first conductor is severed (e.g., by etching and/or sawing) the first conductor from a first wafer cut extending through the first wafer. For example, the first wafer is cut and the first conductor is severed by etching, sawing, jetting, or lasing in accordance with processing steps introduced from the bottom side of the first wafer. The first wafer cut does not extend (e.g., completely) through the second wafer such that the bonded wafer assembly remains at least partially physically connected (e.g., as a unitary physical assembly) after the first conductor is severed by the first wafer cut. The supporting material (e.g., cured encapsulate) protects the first conductor from loss of structural and/or electrical integrity due to the forces encountered during the cutting operation.

Severing the first conductor forms a first-conductor-first-segment including the original first end and a first newly cut end (and forms a first-conductor-second-segment including the original second end and a second newly cut end). The first newly cut end includes an exposed surface that is tangent to the run of the first-conductor-first-segment (and the second newly cut end includes an exposed surface that is tangent to the run of the first-conductor-second-segment).

After the first conductor is severed by the first wafer cut, the exposed edge of the first newly cut end (e.g., which is formed above the first wafer) is electrically coupled to (e.g., at least one) associated IO pad (e.g., which is formed in or on a lower surface of the first wafer). The first newly cut end is coupled to the associated IO pad by forming a second conductor in accordance with a non-TSV redistribution layer (RDL) process.

The second conductor can be formed by depositing a (e.g., vertically extending) conductive layer over (e.g., tangent to) the exposed edge of the first newly cut end of the first conductor. The patterning and deposition of the second conductor conductive layer extends generally downwards to the associated IO pad such that the first conductor is electrically coupled (through the second conductor) to one or more associated IO pads. For example, a first portion of second conductor is vertically disposed (e.g., running downwards along an edge of the first wafer cut from the exposed edge of the first newly cut end) and second portion of the second conductor is horizontally disposed (running horizontally from the edge of the first wafer cut to an associated IO pad). Accordingly, the (e.g., relatively expensive) use of TSVs is obviated by the described embodiment.

FIG. 1 is a section view of a bonded wafer assembly including exposed bonding wire(s) in accordance with example embodiments. The bonded wafer assembly 100 is shown at a stage of the manufacturing process where a selected portion of the second wafer (e.g., glass) has been removed. The removal of the selected portions of the second wafer (e.g., by a "swizzle stick" process) forms windows 130*a* and 130*b*, where each window 130*a* and 130*b* includes an upper surface covered by an oxide layer 132. Each of windows 130*a* and 130*b* covers a respective one of sealed cavities 126*a* and 126*b*, which are formed between portions of the first (e.g., 110) and second (e.g., 1130 of FIG. 11) wafers. The swizzle stick formation and removal process is fully explained in commonly owned U.S. Pat. No. 8,257,985 ("MEMS device and fabrication method") to Stevenson, et al., which is hereby fully incorporated by reference herein.

The removal of the selected portions of the second wafer also forms a cavity 102, which includes a surface formed by a first surface of the first wafer. The bonding pads 108 and 118 are formed in the first (e.g., upper) surface of first wafer 110 for affixing a first conductor (e.g., bonding wire) in subsequent processing steps. (In another embodiment, the bonding pads 108 and 118 are formed in the first wafer before the second wafer is bonded above the first wafer.) The first bonding pad 108 is electrically coupled to circuitry of a first MEMS device 104*a*, whereas the second bonding pad 118 is electrically coupled to circuitry of the second MEMS device 104*b*.

For example, the window 130*a* is affixed to (and supported by) the first wafer 110 by a side wall, which includes an adhesive layer 124, conductors 122, and interposer 120. The interposer is supported by and coupled to a low temperature metal layer 116, a higher temperature metal layer 114, and an (e.g., eutectic alloy) intermetallic layer 112 formed in the first wafer 110. The metal layers (e.g., 112, 114, and 116) are formed to provide proper spacing and adhesion between the first wafer 110 and the interposer 120. Accordingly, a sealed cavity 126*a* and 126*b* is respectively formed beneath each of the windows 130*a* and 130 (e.g., each sealed cavity 126*a* and 126*b* includes a respective MEMS device 104*a* and 104*b*), and each sealed cavity is included in a separate die after singulation in a subsequent processing step (see FIG. 10, for example). The MEMS devices 104*a* and 104*b* are arranged on (and/or above) the substrate 110.

Figure 2:
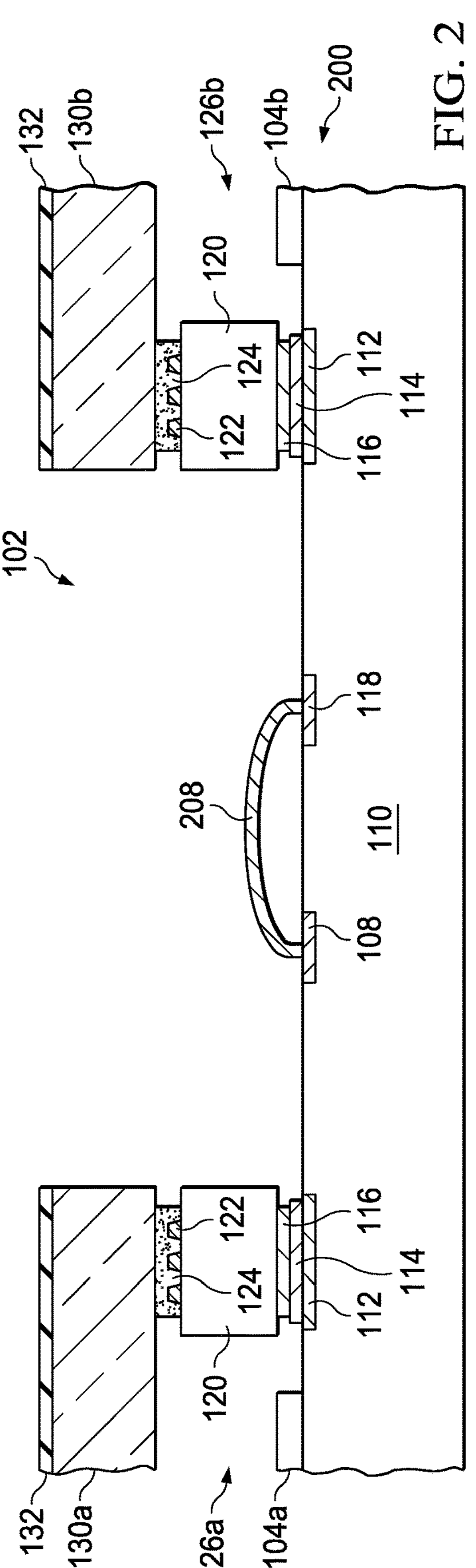
FIG. 2 is a section view of a bonded wafer assembly including a first conductor coupled to exposed bonding pads in accordance with example embodiments.

FIG. 2 is a section view of a bonded wafer assembly including a first conductor coupled to exposed bonding pads in accordance with example embodiments. The bonded wafer assembly 200 is a bonded wafer assembly such as the bonded wafer assembly 100 upon which processes described with respect to FIG. 2 have been performed.

The bonded wafer assembly 200 includes a first conductor 208 disposed on (e.g., affixed to) the first (e.g., upper) surface of the first wafer 110, which includes the exposed bonding pads 108 and 118 formed therein. The first conductor (e.g., bonding wire) 208 is affixed between each of the two bonding pads 108 and 118 such that a central portion of the first conductor 208 is elevated above a substrate formed by the first wafer 110. Microelectronic packaging structures with bonding elements are described in U.S. Pat. Nos. 8,878,353 and 9,095,074, both to Haba, et al., which are hereby fully incorporated by reference herein.

For example, the first conductor 208 is a bonding wire including an original first end affixed to a first bonding pad 108 in the first wafer 110 and including an original second end affixed to a second bonding pad 118 of the first wafer 110. In subsequent processing steps (see FIG. 8, for example), the first conductor 208 is severed in a central portion of the first conductor 208. Severing the first conductor 208 forms a first-conductor-first-segment including the original first end (e.g., affixed to bond bad 108) and a first newly cut end. The severing of the first conductor 208 also forms a first-conductor-second-segment including the original second end (e.g., affixed to bond bad 118). Each newly cut end of the severed first conductor 208 includes a surface to which a second conductor (e.g., 908) is coupled in a subsequent processing step.

Figure 3:
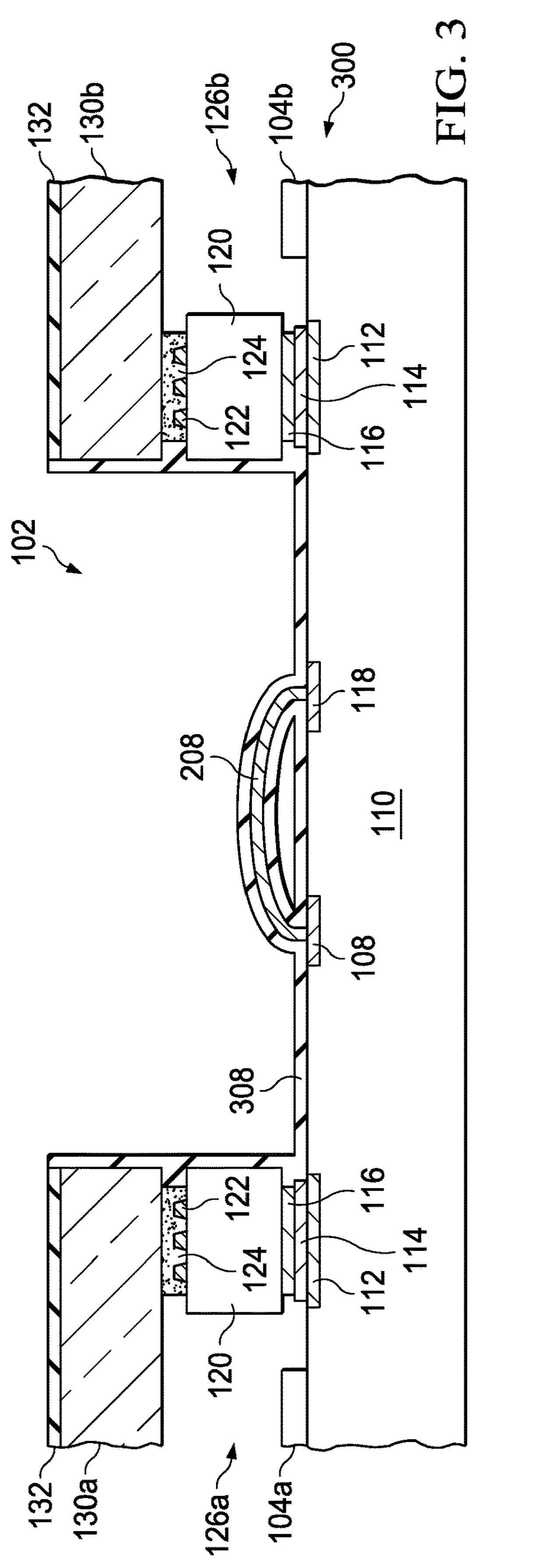
FIG. 3 is a section view of a bonded wafer assembly including an atomic layer deposited over surfaces within the cavity of the bonded wafer assembly in accordance with example embodiments.

FIG. 3 is a section view of a bonded wafer assembly including an atomic layer deposited over surfaces within the cavity of the bonded wafer assembly in accordance with example embodiments. The bonded wafer assembly 300 is a bonded wafer assembly such as the bonded wafer assembly 200 upon which processes described with respect to FIG. 3 have been performed.

The bonded wafer assembly 300 includes an atomic layer deposition 308 for covering and sealing exposed surfaces within the cavity 102 of the bonded wafer assembly 300. For example, the atomic layer deposition (ALD) 308 is a several-atoms-thick layer (e.g., of trimethylaluminum). The ALD 308 is deposited from the upper side of the bonded wafer assembly 300 in accordance with gas phase chemical processes. The ALD 308 is a surface layer for (e.g., hermetically) sealing exposed portions of the exposed structures (e.g., the sidewalls, the surfaces, and the first conductor) that are formed and/or disposed within the cavity 102.

Figure 4:
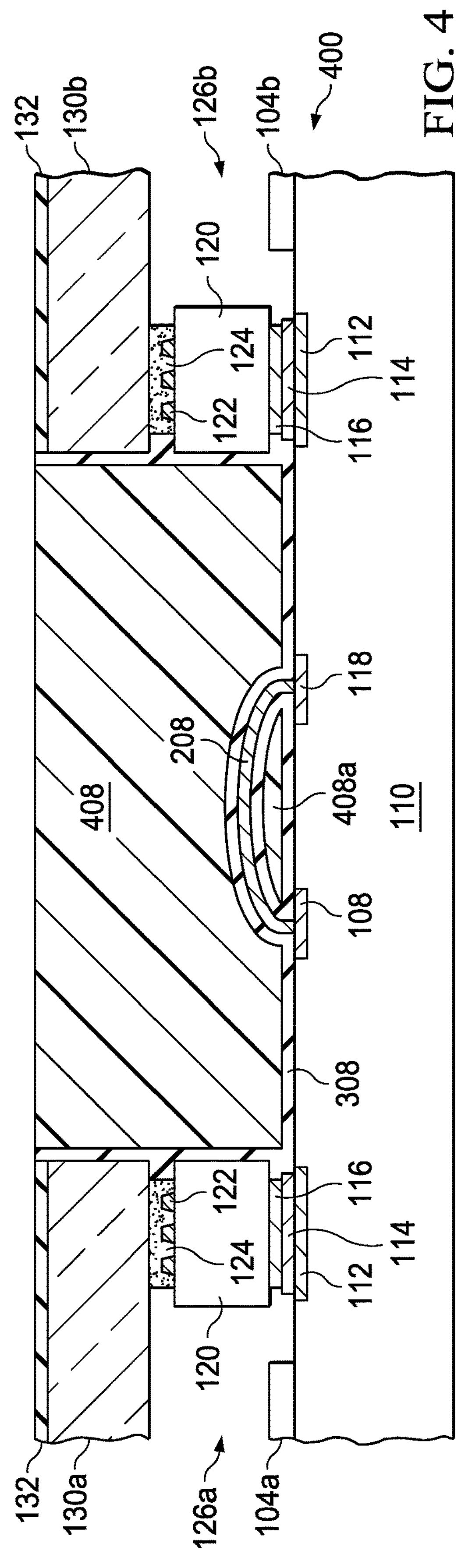
FIG. 4 is a section view of a bonded wafer assembly including an encapsulate for supporting the first conductor in accordance with example embodiments.

FIG. 4 is a section view of a bonded wafer assembly including an encapsulate for supporting the first conductor in accordance with example embodiments. The bonded wafer assembly 400 is a bonded wafer assembly such as the bonded wafer assembly 300 upon which processes described with respect to FIG. 4 have been performed.

The bonded wafer assembly 400 includes an encapsulate 408 for supporting the first conductor 208 within the space of the (e.g., former) cavity 102. For example, the first conductor 208 is encapsulated by encapsulate 408 and supported after the encapsulate is cured. The conductor is encapsulated (e.g., surrounded) by filling the cavity 102 with an initially viscous non-conductive compound. The cavity 102 is filled by injecting or otherwise placing the viscous compound from the upper side of the wafer such that the first conductor 208 is (e.g., substantially) surrounded by the viscous compound. (The first conductor 208 is substantially surrounded by the viscous compound, such as when the viscous compound hardens, so the first conductor does not move while being severed in a subsequent processing operation.) The space (e.g., 408*a*) beneath the first conductor 208 is also filled by the viscous compound flowing around the top and the sides of the first conductor 208 (e.g., including flowing in a third dimension other than the two dimensions of cross-section of FIG. 4). Accordingly, the viscous compound (e.g., encapsulate) is disposed between the first-conductor-first-segment and first-conductor-second-segment.

The viscous compound is cured (e.g., hardened) so that the encapsulate 408 backfilling the cavity (e.g., mechanically) supports the first conductor 208 and prevents the first conductor 208 from moving relative to any other structures in the cavity 102. More particularly, the cured encapsulate 408 prevents the first conductor 208 from being moved while the first conductor 208 is being severed (where such movement can cause an electrical defect and/or shortened life span). In a backfilling embodiment, the encapsulate is extruded into the cavity 102 via a dispensing method. In an epoxy mold compound embodiment, the epoxy mold compound is transferred into the cavity 102 via a film-assisted transfer molding process.

Figures 5, 6:
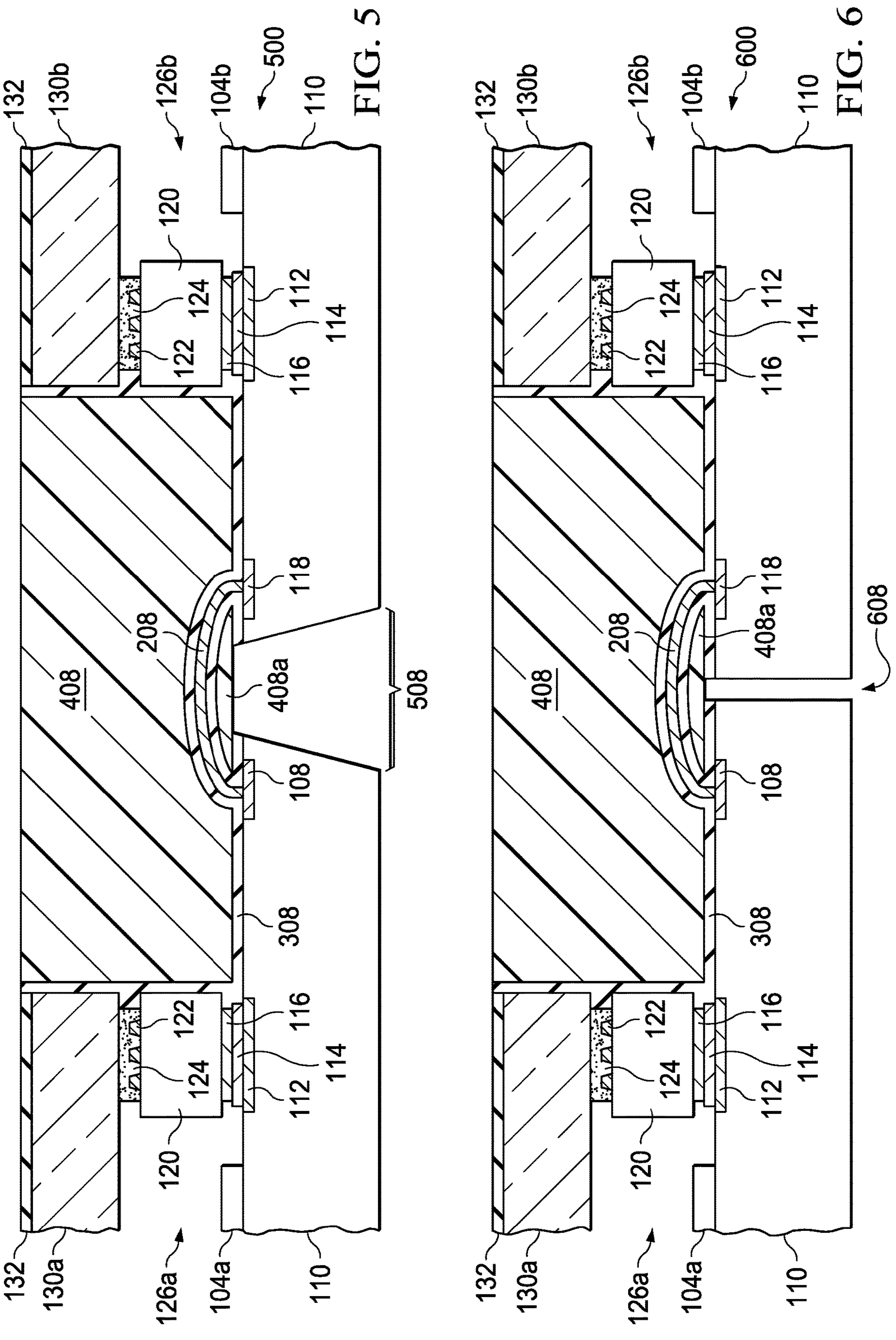
FIG. 5 is a section view of a bonded wafer assembly including a beveled backside channel beneath the first conductor in accordance with example embodiments.
FIG. 6 is a section view of a bonded wafer assembly including a straight-sawn backside channel beneath the first conductor 208 in accordance with example embodiments.

FIG. 5 is a section view of a bonded wafer assembly including a beveled backside channel beneath the first conductor in accordance with example embodiments. The bonded wafer assembly 500 is a bonded wafer assembly such as the bonded wafer assembly 400 upon which processes described with respect to FIG. 5 have been performed.

The bonded wafer assembly 500 includes a beveled backside channel 508 formed in the first wafer 110 beneath the first conductor 208 of the bonded wafer assembly 500. In an etched backside channel embodiment, the beveled backside channel 508 is formed by a backside anisotropic wet etch performed on a second (e.g., lower) surface of the first wafer 110 after the first conductor 208 has been supported by the cured encapsulate 408. The wet etch is halted as the etch (e.g., starts to) exposes the encapsulate 408 (e.g., where the encapsulate 408 is selected to be resistant to a wet etch process for forming the backside channel so the etch does not remove the encapsulate 408 or compromise the ALD 308 and/or the etch is precisely timed to stop at a certain depth). The etched backside beveled backside channel 508 is etched so a portion of the beveled backside channel 508 is (e.g., directly) beneath a central portion of the first conductor 208 (e.g., the central portion of the first conductor 208, which is to be severed).

In a sawn backside channel embodiment, the beveled backside channel 508 is formed by a saw cut using a beveled blade on the lower second of the first wafer 110 (e.g., after the first conductor 208 has been supported by the cured encapsulate 408). The depth of the saw cut is selected to expose the encapsulate 408 (e.g., without exposing a portion of the first conductor 208 or a portion of the ALD 308 deposited directly on the first conductor 208).

FIG. 6 is a section view of a bonded wafer assembly including a straight-sawn backside channel beneath the first conductor 208 in accordance with example embodiments. The bonded wafer assembly 600 is a bonded wafer assembly such as the bonded wafer assembly 400 upon which processes described with respect to FIG. 6 have been performed.

The bonded wafer assembly 600 includes a straight-sawn backside channel 608 formed in the first wafer 110 beneath the first conductor 208 of the bonded wafer assembly 600. In a straight-sawn backside cut embodiment, the channel 608 is formed by cutting away selected portions of the first wafer 110 after the first conductor 208 has been supported by the cured encapsulate 408. The depth of the cut is controlled such that the cut exposes the encapsulate 408 and does not (e.g., substantially) remove the encapsulate 408 or compromise the ALD 308 (e.g., that directly overlies portions of the first conductor 208). The sawn backside channel 608 is cut (e.g., evacuated) such that (e.g., at least) a portion of the sawn backside channel 608 is (e.g., directly) beneath a portion of the first conductor 208. (In various embodiments the width of a saw cut, such as saw cut 608, can be equal to or greater than the depth of the saw cut to facilitate patterning of a conductive surface deposited on a side edge of the saw cut.)

The straight-sawn backside cut embodiment is further processed in accordance with various processes (described hereinbelow) before singulation: the backside channel 608 is insulated and used to access and sever a central portion of the first conductor 208; the second conductor is formed having a portion covering the newly cut end (e.g., newly exposed edge) of the first conductor 208; and the second conductor is coupled to an IO pad formed in or on a lower surface of the first wafer.

Figures 7, 8:
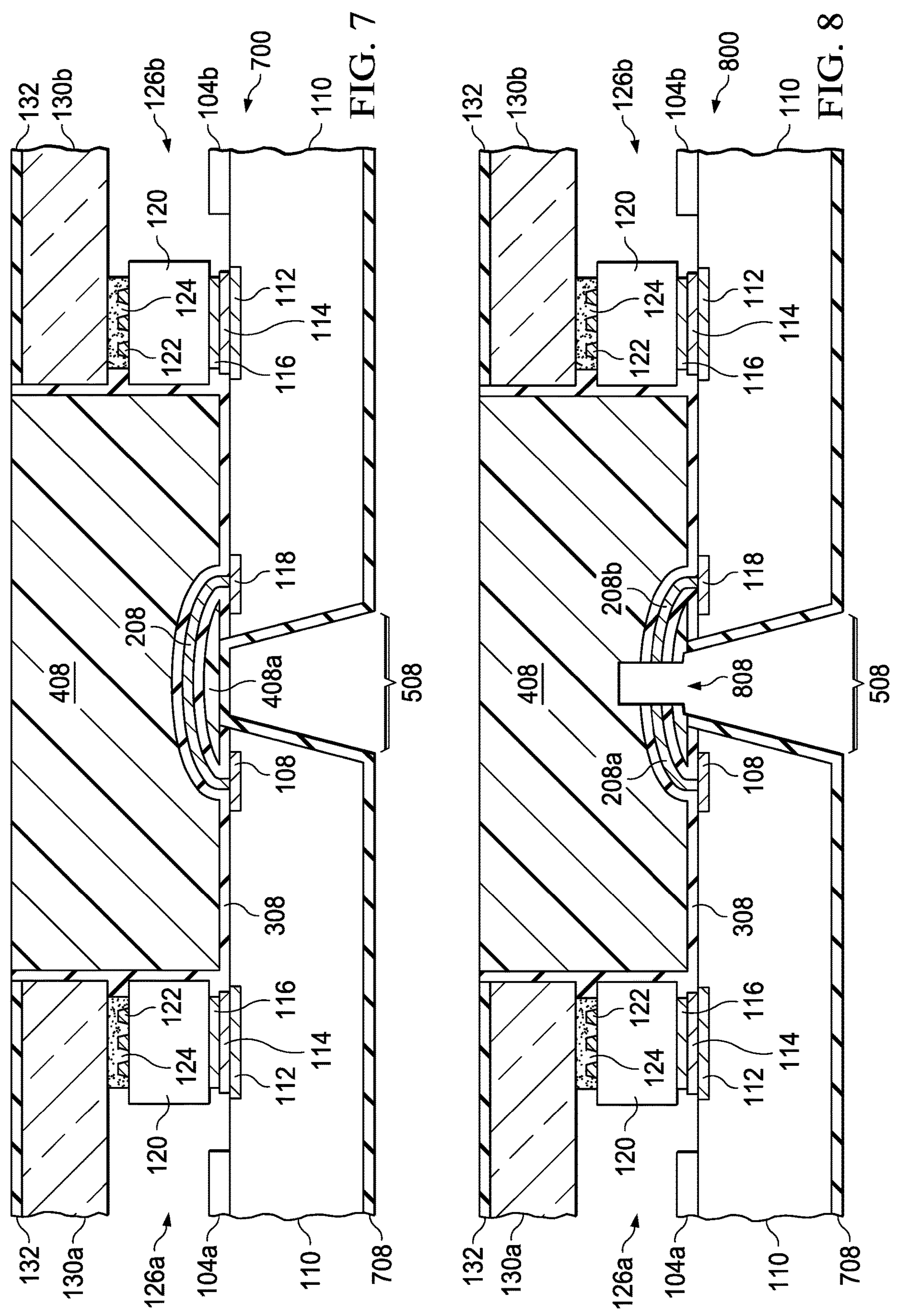
FIG. 7 is a section view of a bonded wafer assembly including a backside insulating layer in accordance with example embodiments.
FIG. 8 is a section view of a bonded wafer assembly including a sawn backside decoupling channel in accordance with example embodiments.

FIG. 7 is a section view of a bonded wafer assembly including a backside insulating layer in accordance with example embodiments. The bonded wafer assembly 700 is a bonded wafer assembly such as the bonded wafer assembly 500 upon which processes described with respect to FIG. 7 have been performed.

The bonded wafer assembly 700 includes a backside insulating layer 708. For example, the backside insulating layer 708 is formed on exposed lower surfaces of the second surface of the first wafer 110 and on the surfaces of the backside channel 508 (or 608, for example) of the bonded wafer assembly 700. The insulating layer 708 can be an oxide layer suitable for depositing a conductive layer thereon and that is deposited from the bottom side of the bonded wafer assembly 700.

The insulating layer 708 electrically insulates any potentially conductive surfaces of any portion of the exposed structures (e.g., sidewalls, surfaces, and first wafer 110) formed and/or disposed in or around the backside channel 508 (or 608, for example). The insulating layer 708 is for insulating various conductive structures from the yet-be-deposited second (e.g., vertically extending) conductor. In an embodiment, the backside insulation layer is a sprayed polyimide polymer layer, sprayed to accommodate the high topology (e.g., vertically extending rough edges) of features of the second surface of the first wafer 110.

FIG. 8 is a section view of a bonded wafer assembly including a sawn backside decoupling channel in accordance with example embodiments. The bonded wafer assembly 800 is a bonded wafer assembly such as the bonded wafer assembly 700 upon which processes described with respect to FIG. 8 have been performed.

The bonded wafer assembly 800 includes a sawn backside decoupling channel 808. For example, the sawn backside decoupling channel 808 formed by sawing through: the insulating layer 708; *a* lower portion of the encapsulate 408 and 408*a*; the ALD 308; a central portion of the first conductor 208; and an upper portion (but not all) of the encapsulate 408 above the first conductor 208. (Sawing through all of the upper portion of the encapsulate 408 would otherwise potentially singulate the bonded wafer assembly.)

Severing the first conductor 208 forms a first-conductor-first-segment 208*a*, which includes the original first end (which remains affixed to the bod pad 118) and a first newly cut end (which includes an exposed edge, which is exposed to in a first surface of the newly-formed decoupling channel 808). Severing the first conductor 208 also forms a first-conductor-second-segment 208*b*, which includes the original second end (which remains affixed to the bod pad 118) and a second newly cut end (which includes an exposed edge in a second surface of the decoupling channel 808). The cut forming the decoupling channel 808 does not extend (e.g., completely) through the second wafer such that the bonded wafer assembly 800 remains at least partially physically connected and can be handled as a unit.

Accordingly, the decoupling channel 808 is a (e.g., bottom-facing) cavity formed above the backside channel 508 (or 608, for example). The bonded wafer assembly 800 remains at least partially physically connected (e.g., by remaining portions of encapsulate 408) after the first conductor 208 is severed. In at least one example, maintaining the monolithic unity of the bonded wafer assembly 800 facilitates simultaneous processing of the integrated circuits on the bonded wafer assembly 800 until such time the bonded wafer assembly 800 is to be singulated. As described herein, the encapsulate 408 (and 408*a*) supports (e.g., protects the mechanical and electrical integrity) of the first conductor 208 during the severing process (which, for example, increases yield and provides lower-cost processes for manufacturing more highly integrated devices having relatively smaller footprints).

The first newly cut end of the severed first-conductor-first-segment 208*a* includes an exposed edge that is exposed in a first surface of the decoupling channel 808 formed by the severing process. The exposed edge includes a conductive surface suitable for deposition of a directly applied conductive layer for coupling a signal carried by the first-conductor-first-segment 208*a*. As described herein, the encapsulate 408 (and 408*a*) supports the first conductor 208 after the severing process, which provides an even surface (e.g., of the vertically extending wall of the decoupling channel 808) for a highly reliable deposition of a (e.g., yet-to-be deposited) conductive layer over the exposed edge (e.g., conductive end surface) of the first-conductor-first-segment 208*a*.

Figure 9:
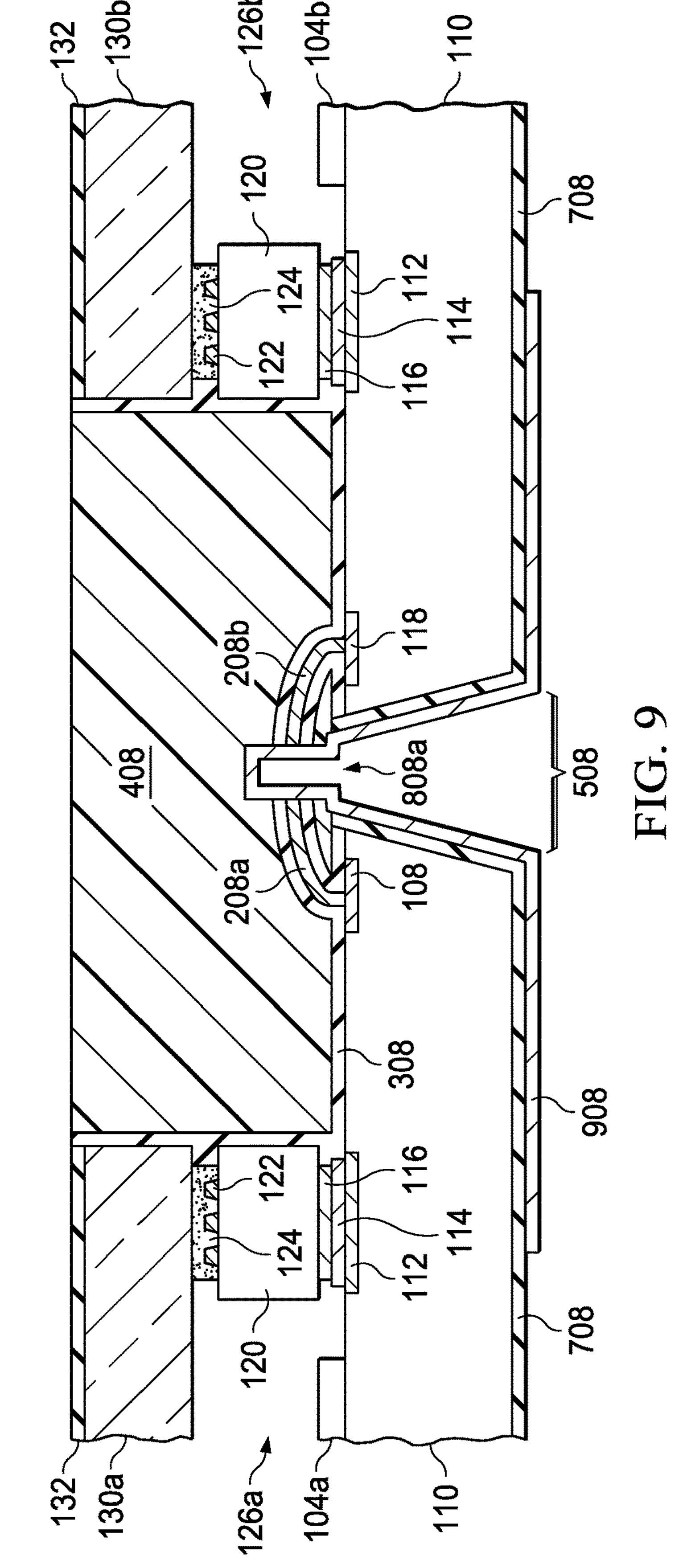
FIG. 9 is a section view of a bonded wafer assembly including a backside conductive layer in accordance with example embodiments.

FIG. 9 is a section view of a bonded wafer assembly including a backside conductive layer in accordance with example embodiments. The bonded wafer assembly 900 is a bonded wafer assembly such as the bonded wafer assembly 800 upon which processes described with respect to FIG. 9 have been performed.

The bonded wafer assembly 900 includes a backside conductive layer 908. For example, the backside conductive layer 908 is formed by depositing and selectively patterning a conductive layer 908 over exposed structures of the bottom portion (e.g., backside) of the bonded wafer assembly 900. The backside conductive layer 908 is a metal or otherwise conductive material deposited over selectively masked surfaces including the portions of the left, top, and right surfaces of the decoupling channel 808 (such that the decoupling channel 808*a* is narrowed). The backside conductive layer 908 is patterned (e.g., to form separate conductive surfaces) after deposition to bring each individual IO line out to the back surface (which separates IO lines, which would otherwise be shorted together). Accordingly, more than one second (e.g., vertically extending) conductors can be formed on a selected side of the decoupling channel 808 and the beveled backside channel 508.

Generally, the more vertical are the left and right sides of the decoupling channel, the less is the resolution of the pattering of the conductive lines formed on the sides of the decoupling channel 808. As described above, many designs are "IO limited," which constrains the limit of signals to be routed to and from the die (and/or package). The relatively limited number of IO contacts are routable using patterned second (vertically extending) conductors because the (e.g., lowered) resolution of (e.g., increasingly microscopic) design rules is sufficient to accommodate the (e.g., relatively limited) number of IO signals. Accordingly, more than one die-edge conductor can be formed along a particular decoupling channel 808, and more particularly, more than one die-edge conductor can be formed along a portion of the particular decoupling channel 808 associated with a to-be-formed die.

The backside conductive layer 908 is deposited on the exposed edge of the severed first-conductor-first-segment 208*a*. The backside conductive layer 908 is patterned (e.g., to remove selected portion of the backside conductive layer 908) such that individual mutually separated portions of the backside conductive layer 908 form separate instances of the second conductor. Each of the mutually separated portions of the backside conductive layer 908 forms a second conductor for coupling signals between (e.g., to and from) the severed first-conductor-first-segment 208*a* to an IO pad to be disposed on a lower surface of the bonded wafer assembly 900. Accordingly, the second conductor is formed by a conductive, non-TSV (through-silicon via) redistribution layer (RDL) process.

The second conductor is formed by depositing the (e.g., vertically extending) conductive layer 908 on the exposed edge of the first conductor such that the first conductor 208 (on a first surface of the first wafer) is electrically coupled to a second conductor for coupling to one or more associated IO pads (on the opposite surface of the first wafer). Accordingly, the associated costs of using TSVs for routing signals from a first surface of a bonded wafer assembly to an opposite surface beneath the bonded wafer assembly is obviated in a described embodiment.

Figure 10:
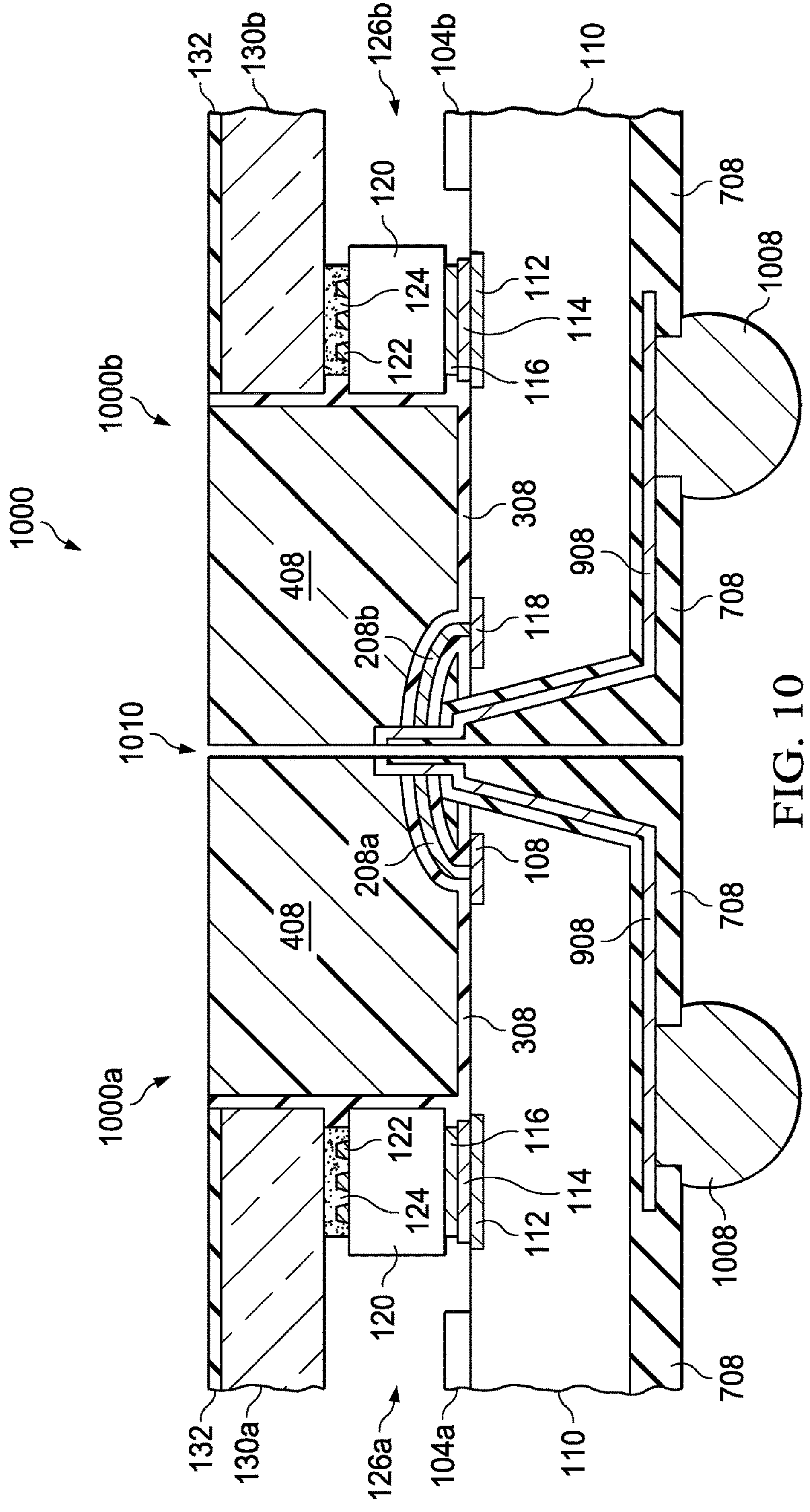
FIG. 10 is a section view of a singulated bonded wafer assembly including a die-edge second conductor for electrical communication between a first surface and a second surface of the substrate below the first surface in accordance with example embodiments.

FIG. 10 is a section view of a singulated bonded wafer assembly including a die-edge second conductor for electrical communication between a first surface and a second surface of the substrate below the first surface in accordance with example embodiments. The bonded wafer assembly 1000 is a bonded wafer assembly such as the bonded wafer assembly 900 upon which processes described with respect to FIG. 10 have been performed.

The singulated bonded wafer assembly 1000 includes a die-edge second conductor 908 for electrical communication between a first (e.g., upper) surface and the second (e.g., lower) surface of the first wafer 110 in accordance with example embodiments. For example, additional insulating layer 708 material is deposited in and over the backside conductive layer 908, the beveled backside channel 508, and masked portions of the backside of the bonded wafer assembly 1000. The additional insulating layer 708 material is deposited to fill the beveled backside channel such that the backside of the bonded wafer assembly 1000 can be planarized. The masks (not shown) are removed such that the previously masked portions include an exposed surface of the second conductor (of the backside conductive layer 908). The solder balls 1008 are formed on exposed surfaces of the backside conductive layer, where the solder balls are arranged for surface mounting of chips singulated from the bonded wafer assembly 1000.

After the deposition of the additional insulating layer 708 material, the bonded wafer assembly 1000 is singulated (e.g., into individual die), such as by sawing the wafer in accordance with a "saw-lane" area to form the saw cut 1010 between bonding pads 108 and 118. The saw cut 1010 extends from the (e.g., upper) surface of the bonded wafer assembly 1000 to the lower surface of the bonded wafer assembly 1000 and severs the encapsulate 408, the ALD 308, the first conductor 208, the backside conductive layer 908, and the insulating layer 708.

The saw cut 1010 is made along the saw-lane to form a first (e.g., singulated) chip (e.g., 1000*a*) and a second chip (e.g. 1000*b*) physically separate from the first chip 1000*a*.

Severing the second conductor separates the second conductor into a second-conductor-first-segment and a second-conductor-second-segment, such as where the second-conductor-first-segment is isolated (e.g., electrically and mechanically separated) at the left of the saw cut 1010 and the second-conductor-second-segment is isolated at the right of the saw cut 1010.

Accordingly, the second conductor 908 is a structure for coupling signals from circuits and structures of the first (e.g., upper) surface of the first wafer 110 to structures (e.g., surface mounting contacts such as solder balls 1008) on the second (e.g., lower) surface of the first wafer 110. The second conductor 908 extends through wafer 110 (which can be a substrate) and can be situate along a die edge of a die that is singulated from the wafer 110. (The term "die edge" can mean "adjacent to a physical die edge," "close to the physical die edge," and "peripherally located with respect to the sealed cavity or MEMS device.")

The front, back, and left sides of chip 1000*a* (not shown in FIG. 10) are likewise processed and singulated in like manner to the right side of chip 1000*a* as described with reference to FIG. 1 through FIG. 10 (e.g., such that a rectangular die is formed). Accordingly, a quantity of chips (e.g., dies) is generated from a single bonded assembly wafer. Each of the quantity of chips includes die-edge-coupled conductors disposed around one or more of the sides of each respective chip.

Figure 11:
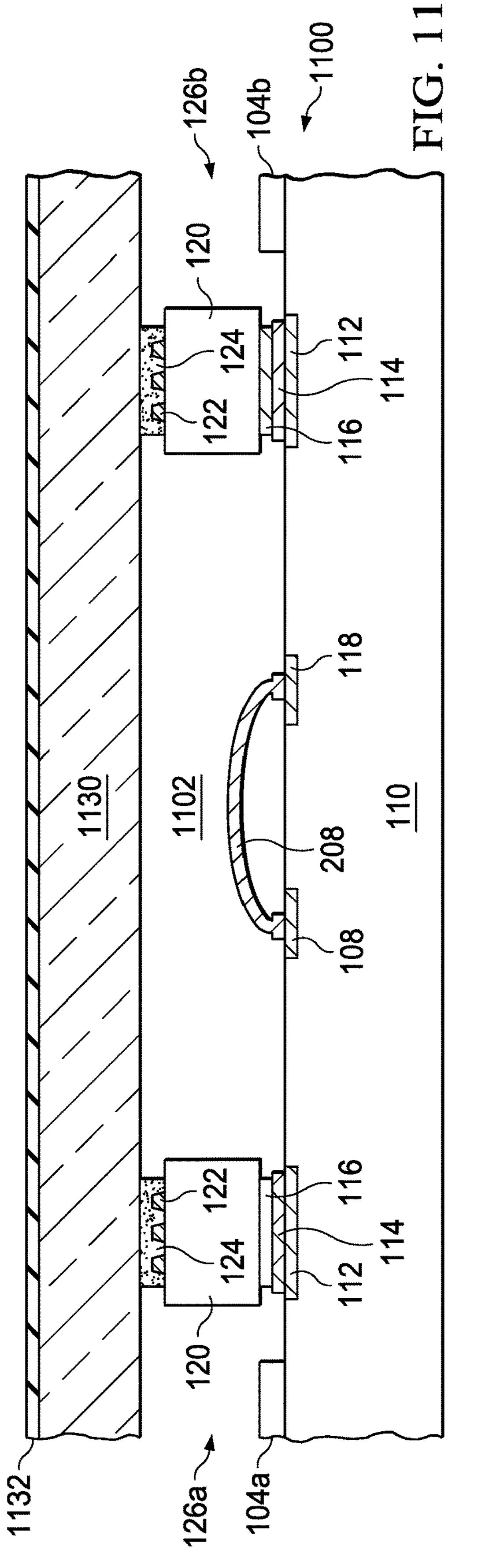
FIG. 11 is a section view of a bonded wafer assembly including a unitary window enclosing a first conductor affixed to bonding pads in accordance with example embodiments.

FIG. 11 is a section view of a bonded wafer assembly including a unitary window enclosing a first conductor affixed to bonding pads in accordance with example embodiments. The bonded wafer assembly 1100 is shown at a stage of the manufacturing process where the bonding pads 108 and 118 are formed in the first (e.g., upper) surface of first wafer 110 and each original end of the first conductor 208 is affixed to the respective bonding pad. The second wafer 1130 includes an upper surface blanketed by oxide layer 1132.

The bonded wafer assembly 1100 includes an (e.g., uncut) unitary second wafer 1130, which when bonded to the first wafer, encloses the first conductor 208 affixed to the bonding pads 108 and 118. Accordingly, the first conductor 208 is enclosed in a sealed cavity 1102 such that no portion of the sealed cavity 1102 (e.g., including the first conductor 208) is accessible from the top (or bottom) of the bonded wafer assembly 1100.

The second wafer 1130 is affixed to (and supported by) the first wafer 110 by a side wall, which includes an adhesive layer 124, conductors 122, and interposer 120. The interposer is supported by and coupled to a low temperature metal layer 116, a higher temperature metal layer 114, and an intermetallic layer 112 formed on the first wafer 110. Various sealed cavities are formed beneath the second wafer 1130, such as sealed cavities 126*a* and 126*b* and the sealed cavity 1102 including the first conductor (e.g., bonding wire) 208.

Further processing of the bonded wafer assembly 1100 includes processes described with respect to various drawings. After performing the processing steps of backside anisotropic etching (similar to the processes of FIG. 5 and FIG. 13), backside insulation layer depositions (similar to the processes of FIG. 7 and FIG. 13), the process of FIG. 15 (e.g., backside encapsulate fill), and the process of FIG. 16 (e.g., backside channel evacuation), the processing continues as described above with respect to FIG. 8 (e.g., forming of decoupling channel), FIG. 9 (e.g., second conductor deposition), and FIG. 10 (e.g., insulating layer deposition and singulation). Accordingly, the bonded wafer assembly 1100 is processed to produce singulated die, where each singulated die includes one or more second conductors along a die-edge for coupling signals between structures formed in the first (upper) surface of the substrate and structures formed in the second (lower) surface of the substrate.

Figure 12:
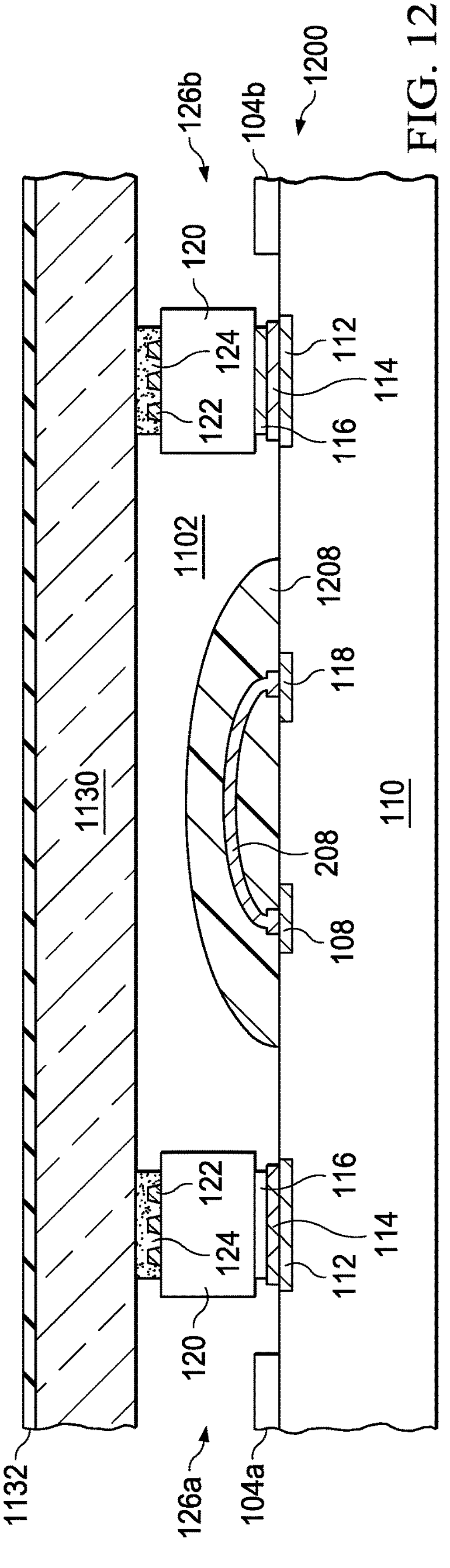
FIG. 12 is a section view of a bonded wafer assembly including a potted first conductor affixed to bonding pads in accordance with example embodiments.

FIG. 12 is a section view of a bonded wafer assembly including a potted first conductor affixed to bonding pads in accordance with example embodiments. The bonded wafer assembly 1200 is shown at a stage of the manufacturing process where the first conductor 208 is "potted" (e.g., secured, encapsulated, and protected) by a supporting material such as potting compound 1208. The potting compound 1208 is an encapsulate for surrounding the structure (e.g., first conductor), which is affixed to pads 108 and 118 formed in the first (e.g., upper) surface of first wafer 110. For example, the first conductor 208 is "potted" before the second wafer 1130 is bonded as a bonded wafer assembly.

Figures 13, 14:
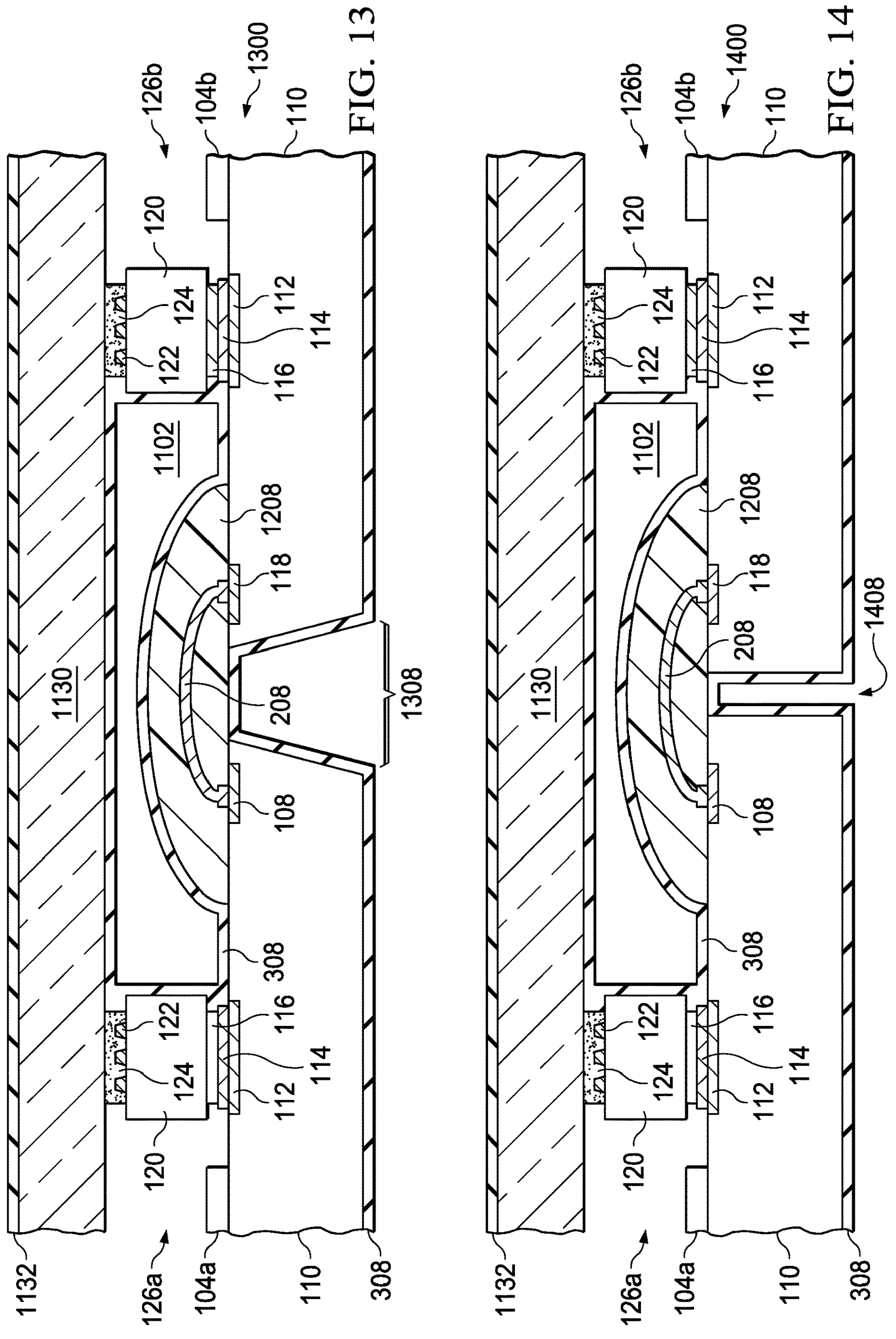
FIG. 13 is a section view of a bonded wafer assembly including a potted first conductor and a beveled backside channel beneath the first conductor in accordance with example embodiments.
FIG. 14 is a section view of a bonded wafer assembly including a potted first conductor and a straight cut backside channel formed beneath the first conductor of the bonded wafer assembly in accordance with example embodiments.

Further processing of the bonded wafer assembly 1200 includes processes described with respect to various drawings. The bonded wafer assembly 1200 can be processed by performing the processing steps described below with reference to FIG. 13 (e.g., backside anisotropic etching) or FIG. 14 (e.g., backside cut), where the processing of either FIG. 13 or FIG. 14 is followed by a backside encapsulate fill (similar to the process of FIG. 15) and a backside channel evacuation (similar to the process of FIG. 16), followed by performing the processing steps as described above with respect to FIG. 8 (e.g., forming of decoupling channel), FIG. 9 (e.g., second conductor deposition), and FIG. 10 (e.g., insulating layer deposition and singulation). Accordingly, the bonded wafer assembly 1200 is processed to produce singulated die, where each singulated die includes one or more second conductors along a die-edge for coupling signals between structures formed in the first (upper) surface of the substrate and structures formed in the second (lower) surface of the substrate.

FIG. 13 is a section view of a bonded wafer assembly including a potted first conductor and a beveled backside channel beneath the first conductor in accordance with example embodiments. The processes described in FIG. 13 are applied to the bonded wafer assembly 1200 (e.g., which shows processes described in FIG. 12). The bonded wafer assembly 1300 includes an etched backside channel 1308 formed in the first wafer 110 beneath the first conductor 208 of the bonded wafer assembly 1300.

In an etched backside channel embodiment, the backside channel 1308 is formed by a backside anisotropic wet etch performed on the lower surface of the first wafer 110. The wet etch is halted after the etch removes a sufficient portion of the first wafer 110 to expose the cavity 1102 under second wafer 1130 (including the potting compound 1208 potting the first conductor 208). The etched backside channel 1308 is etched such that an evacuated portion of the etched backside channel 1308 is (e.g., directly) beneath a central portion of the first conductor 208.

After formation of the backside channel 1308, an ALD 308 layer is deposited to protect and seal structures within the cavity 1102 (including potting compound 1208) under second wafer 1130.

Processing of the bonded wafer assembly 1300 is continued with the processes described with respect to FIG. 8 (e.g., forming of decoupling channel), FIG. 9 (e.g., second conductor deposition), and FIG. 10 (e.g., insulating layer deposition and singulation).

FIG. 14 is a section view of a bonded wafer assembly including a potted first conductor and a cut backside channel formed beneath the first conductor of the bonded wafer assembly in accordance with example embodiments. The processes described in FIG. 14 are applied to the bonded wafer assembly 1200 (e.g., which shows processes described in FIG. 12). The bonded wafer assembly 1400 includes a cut backside channel 1408 formed in the first wafer 110 beneath the first conductor 208.

In a (e.g. straight) cut backside channel embodiment, the cut backside channel 1408 is formed by a cutting the lower surface of the first wafer 110 before the first conductor 208 has been supported by the encapsulate 1508 (described below with reference to FIG. 15). The backside channel 1408 is formed by controlling the depth of the cut such that the cut does not compromise or disturb the first conductor 208. The sawn backside channel 1408 is cut so a portion of the sawn backside channel 1408 is (e.g., directly) beneath a central portion of the first conductor 208 (e.g., a central portion at which the first conductor 208 is to be severed).

After forming the sawn backside channel 1408, an ALD 308 layer is deposited to protect and seal structures within the cavity under second wafer 1130. Processing of the bonded wafer assembly 1300 is continued with the processes described with respect to FIG. 8 (e.g., forming of decoupling channel), FIG. 9 (e.g., second conductor deposition), and FIG. 10 (e.g., insulating layer deposition and singulation).

Figures 15, 16:
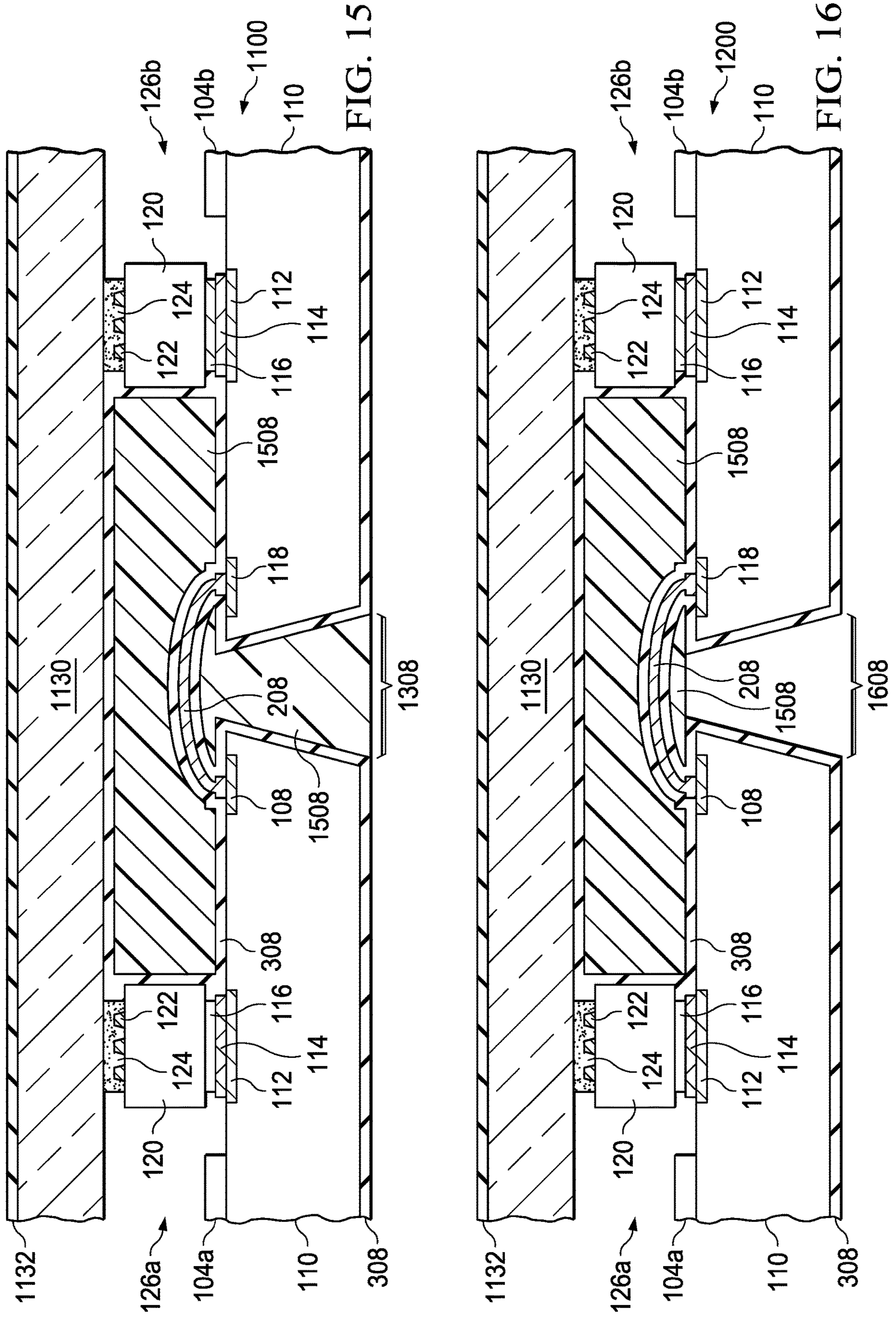
FIG. 15 is a section view of a bonded wafer assembly including a backside-injected encapsulate beneath the first conductor in accordance with example embodiments.
FIG. 16 is a section view of a bonded wafer assembly including a reopened beveled backside channel in accordance with example embodiments.

FIG. 15 is a section view of a bonded wafer assembly including a backside-injected encapsulate beneath the first conductor in accordance with example embodiments. The processes described in FIG. 15 are applied to the bonded wafer assembly 1100 (e.g., which shows processes described in FIG. 11). The bonded wafer assembly 1500 includes a backside-injected encapsulate 1508 encapsulating the first conductor 208 (and the ALD 308) and filling a previously formed backside channel 1308.

In a backside channel embodiment, the backside channel 1308 is formed by one or more beveled saw cuts, which opens the cavity 1102 from the backside. (The unitary second wafer 1130, which remains uncut, prevents the bonded wafer assembly 1300 from being singulated at this point.) After the cavity 1102 has been opened from the backside, an ALD 308 layer is deposited to protect and seal structures (such as the bonding wire 208) within the cavity 1102 under the second wafer 1130.

The first conductor 208 (and ALD 308) is encapsulated by filling the cavity 1102 with an initially viscous non-conductive compound such that the first conductor 208 is surrounded by the viscous compound. In an embodiment, the bonded wafer assembly is inverted (e.g., flipped over) and the cavity 1102 is filled using a dispensing nozzle inserted through the backside channel 1308. The empty space surrounding the first conductor 208 is filled by the viscous compound flowing around the top and the sides of the first conductor 208 (e.g., including flowing in a third dimension not illustrated by the cross section of FIG. 15).

The viscous compound can be injected directly into the cavity 1102 by inserting the tip of a dispensing nozzle through the backside channel 1308 and into the cavity 1102 such that air in cavity 1102 freely exhausts through the backside channel 1308 and the viscous compound substantially fills the cavity 1102. The viscous compound is cured (e.g., hardened) to form the (e.g., cured) encapsulate 1508. The encapsulate 1508 is a supporting material, which substantially fills the (e.g., former) cavity 1102 such that the first conductor 208 is supported, protected, or prevented from moving relative to any other structure in the bonded wafer assembly 1500.

Processing of the bonded wafer assembly 1500 is continued with the processes described with respect to FIG. 16.

FIG. 16 is a section view of a bonded wafer assembly including a reopened beveled backside channel in accordance with example embodiments. The processes described in FIG. 16 are applied after applying the processes described in FIG. 15. The bonded wafer assembly 1600 including a reopening of the etched backside channel 1308 formed in the first wafer 110.

In an embodiment, the backside channel 1308 is reopened by removing a portion of the encapsulate 1508 by performing one or more beveled saw cuts. The beveled saw cuts can be set to a selected depth such that the lower margin of the former cavity 1102 is exposed by the (e.g., reopened) backside channel 1308.

Processing of the bonded wafer assembly 1600 is continued by performing the processing steps as described above with respect to FIG. 8 (e.g., forming of decoupling channel), FIG. 9 (e.g., second conductor deposition), and FIG. 10 (e.g., insulating layer deposition and singulation).

Modifications are possible in the described embodiments, and other embodiments are possible, within the scope of the claims.

What is claimed is:

1. A device comprising:
- a substrate having a first surface and a second surface opposite the first surface;
- circuitry on the first surface;
- a surface mounting contact structure on the second surface;
- a bond pad on the first surface of the substrate;
- a first conductor having a first end affixed to the bond pad, the first conductor electrically coupled to the circuitry, the first conductor having an elevated portion that includes a second end elevated with respect to the first surface and the bond pad;
- a supporting material between the first surface and the elevated portion; and
- a second conductor electrically coupling the second end to the surface mounting contact structure, the second conductor contacting the second end of the first conductor at an elevated position with respect to the first surface and the bond pad.

2. The device of claim 1, wherein the supporting material is a curable encapsulate or potting compound.

3. The device of claim 1, wherein the surface mounting contact structure is a solder ball.

4. The device of claim 1, wherein the substrate is a first substrate, the device further comprising:
- a second substrate;
- an interposer between the first surface and the second substrate, a cavity between the first substrate and the second substrate; and
- a microelectromechanical system (MEMS) device on the first surface in the cavity, the MEMS device comprising the circuitry.

5. The device of claim 1, wherein the substrate has a third surface between the first surface and the second surface, and the second conductor is on the third surface and on the second surface.

6. A device comprising:
- a substrate having a first surface, a second surface, and a third surface, the second surface opposite the first surface and the third surface connecting the first surface and the second surface, the third surface along an outer edge of the substrate;
- a bonding pad on the first surface;

a first conductor having a first end electrically coupled to the bonding pad, the first conductor having a second end elevated with respect to the first surface and the bonding pad; and a second conductor on the second surface and along the third surface, the second conductor having a portion with an end extending above the first surface, the end of the second conductor electrically coupled to the second end of the first conductor.

7. The device of claim 6, herein the first conductor has an elevated portion, the device further comprising a supporting material between the elevated portion and the first surface.

8. The device of claim 6, wherein the device further comprises:

an atomic layer on the first conductor; and encapsulate on the first conductor.

9. The device of claim 6, further comprising an insulating material between the second conductor and the second surface and outside the second conductor.

10. The device of claim 6, further comprising a solder ball on the second conductor.

11. The device of claim 6, further comprising a micro-electromechanical system (MEMS) device on the first surface, the MEMS device electrically coupled to the bonding pad.

12. The device of claim 6, wherein the third surface is angled.

13. The device of claim 6, wherein the third surface is vertical.

14. The device of claim 6, wherein the first conductor is curved.

15. The device of claim 14, further comprising an atomic layer around the first conductor.

16. A device comprising:

a substrate having a first surface, a second surface, and a third surface, the second surface opposite the first surface and the third surface connecting the first surface and the second surface, the third surface along an outer edge of the substrate;

a first conductor on the first surface, the first conductor having an elevated portion above the first surface, the elevated portion including an elevated end;

a supporting material between the first surface and the elevated portion; and a second conductor on the second surface and along the third surface, the second conductor having a portion with an end extending above the first surface, the end of the second conductor electrically coupled to the elevated end of the elevated portion of the first conductor.

17. The device of claim 16, wherein the second conductor extends above the first conductor.

18. The device of claim 16, further comprising a solder ball on the second conductor.

19. The device of claim 16, wherein the first conductor is curved.

20. The device of claim 16, further comprising circuitry on the first surface, the circuitry electrically coupled to the first conductor.

* * * * *